United States Patent
Huang et al.

(10) Patent No.: US 10,724,803 B2
(45) Date of Patent: Jul. 28, 2020

(54) HEAT PIPE AND METHOD FOR MAKING THE SAME

(71) Applicant: Delta Electronics, Inc., Taoyuan (TW)

(72) Inventors: Shih-Lin Huang, Taoyuan (TW); Chiu-Kung Chen, Taoyuan (TW); Ti-Jun Wang, Taoyuan (TW); Quan Zhang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 178 days.

(21) Appl. No.: 15/397,067

(22) Filed: Jan. 3, 2017

(65) Prior Publication Data

US 2017/0343299 A1    Nov. 30, 2017

(30) Foreign Application Priority Data

May 31, 2016 (CN) .......................... 2016 1 0377732

(51) Int. Cl.
*F28D 15/04* (2006.01)
*H05K 7/20* (2006.01)
*F28D 15/02* (2006.01)
*F28D 21/00* (2006.01)

(52) U.S. Cl.
CPC ....... *F28D 15/046* (2013.01); *F28D 15/0233* (2013.01); *F28D 2021/0028* (2013.01); *H05K 7/20336* (2013.01)

(58) Field of Classification Search
CPC ............... F28D 15/0233; F28D 15/046; F28D 2021/0028; H05K 7/20336
USPC .................................................. 165/104.26
See application file for complete search history.

(56) References Cited

U.S. PATENT DOCUMENTS

| | | | | |
|---|---|---|---|---|
| 3,700,028 | A * | 10/1972 | Noren ................... | F28D 15/046 165/104.26 |
| 3,789,920 | A * | 2/1974 | Low ....................... | F28D 15/046 165/104.26 |
| 4,003,427 | A * | 1/1977 | Leinoff ................. | F28D 15/046 165/104.26 |
| 4,118,756 | A * | 10/1978 | Nelson ................ | F28D 15/0233 165/104.26 |
| 7,472,479 | B2 * | 1/2009 | Hou ........................ | B23P 15/26 165/104.26 |
| 8,074,706 | B2 * | 12/2011 | Su ....................... | F28D 15/0233 165/104.26 |
| 2012/0031587 | A1 * | 2/2012 | Huang .................. | F28D 15/046 165/104.26 |

(Continued)

FOREIGN PATENT DOCUMENTS

| | | |
|---|---|---|
| CN | 1967131 A | 5/2007 |
| CN | 2420604 Y | 4/2015 |
| CN | 104567497 A | 4/2015 |

OTHER PUBLICATIONS

Office Action from the corresponding Chinese application, dated Nov. 6, 2018, 6 pages.

*Primary Examiner* — Leonard R Leo
(74) *Attorney, Agent, or Firm* — Muncy, Geissler, Olds & Lowe, P.C.

(57) ABSTRACT

A heat pipe is provided, including a capillary body. The capillary body has a condensation portion, an evaporation portion, and a connecting portion connecting the condensation portion with the evaporation portion. The capillary body is formed by metal weaving. A cross-section of the evaporation portion is larger than that of the condensation portion.

12 Claims, 11 Drawing Sheets

(56) References Cited

U.S. PATENT DOCUMENTS

| | | | | |
|---|---|---|---|---|
| 2013/0160977 A1* | 6/2013 | Fan | ....................... | F28D 15/046 |
| | | | | 165/104.26 |
| 2013/0255921 A1* | 10/2013 | Dai | ......................... | F28D 15/04 |
| | | | | 165/104.26 |
| 2016/0069616 A1* | 3/2016 | Shen | ..................... | F28D 15/046 |
| | | | | 165/104.26 |

* cited by examiner

HEAT PIPE AND METHOD FOR MAKING THE SAME

CROSS REFERENCE TO RELATED APPLICATIONS

This Application claims priority of China Patent Application No. 201610377732.1, filed on May 31, 2016, the entirety of which is incorporated by reference herein.

BACKGROUND OF THE INVENTION

Field of the Invention

The present invention relates to a heat pipe, and in particular, to a heat pipe comprising a capillary structure formed by metal weaving.

Description of the Related Art

A heat pipe is an element with high thermal conductivity. A conventional heat pipe is formed by a sealed metal pipe and a sintered structure, wherein the sealed metal pipe encompasses the sintered structure.

As the heat pipe has the advantages of being structurally simple and having high thermal conductivity and low thermal resistance, it has been widely used for heat dissipation in electronic devices, and for a variety of different cooling purposes. However, since electronic devices have been developed to be more portable, thinner, and more versatile, the components within these electronic devices have become more compact, and therefore they produce more heat. Thus, conventional heat pipes may not meet the requirements of small dimensions, high thermal transfer, and high heat flux. Therefore, the efficiency of heat pipes needs to be improved.

BRIEF SUMMARY OF THE INVENTION

To solve the problems of the prior art, the embodiment of the invention provides a heat pipe, comprising a capillary body, formed by metal weaving, comprising an evaporation portion, a condensation portion and a connecting portion. The evaporation portion has a first cross-section perpendicular to a central axis of the heat pipe. The condensation portion has a second cross-section perpendicular to the central axis, wherein the first cross-section is larger than the second cross-section. The connecting portion connects the condensation portion with the evaporation portion.

In one embodiment, the heat pipe further comprises a housing encompassing the capillary body.

In one embodiment, a gas channel is formed between the housing, the evaporation portion, the connecting portion, and the condensation portion.

In one embodiment, the heat pipe comprises a working fluid flowing in the evaporation portion, the connecting portion, or the condensation portion.

In one embodiment, the working fluid is evaporated in the evaporation portion.

In one embodiment, the working fluid is condensed in the condensation portion.

In one embodiment, the capillary body has a tubular cavity.

In one embodiment, the heat pipe further comprises a supporting rod disposed in the tubular cavity.

In one embodiment, the tubular cavity is extended through the capillary body.

In one embodiment, the capillary body has plain weave, satin weave, twilled weave, plain Dutch weave, or twilled Dutch weave.

In one embodiment, the capillary body of the condensation portion forms a first angle and a second angle between two interlaced threads thereof, wherein the first angle is smaller than 90 degrees, and the second angle is greater than 90 degrees.

In one embodiment, the capillary body of the connecting portion forms a third angle and a fourth angle between two interlaced threads thereof, wherein the third angle is smaller than 90 degrees, and the fourth angle is greater than 90 degrees.

To solve the problems of the prior art, the embodiment of the invention provides a method for making a heat pipe, comprising steps of producing a capillary body, wherein the capillary body is formed by metal weaving; mounting the capillary body into a housing; and sealing the housing.

In one embodiment, the capillary body is produced by a weaving machine.

In one embodiment, prior to the step of mounting the capillary body into the housing, the method further comprising disposing a supporting rod in the capillary body, wherein the supporting rod protrudes from an end of the capillary body.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
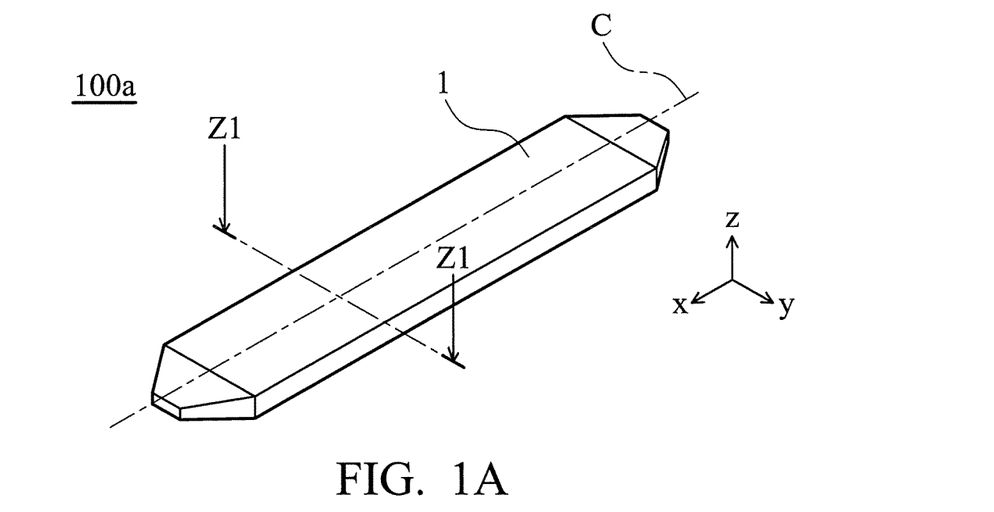
FIG. 1A is a perspective view of a heat pipe according to an embodiment of the invention
Figure 1B:
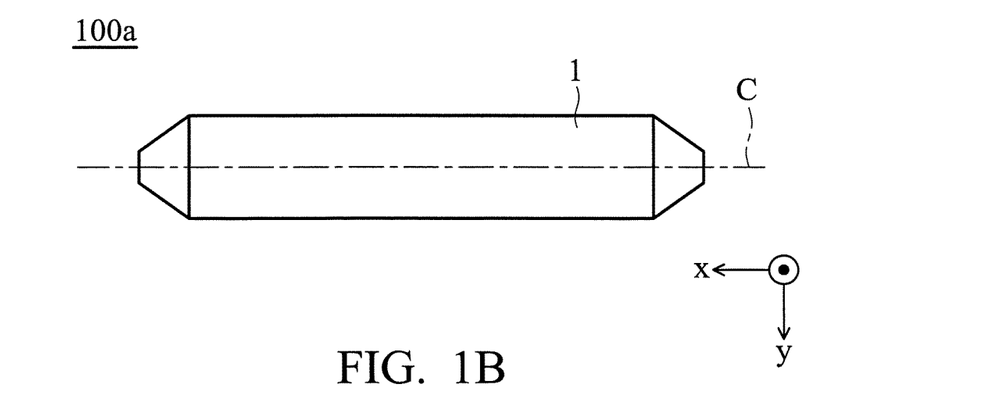
FIG. 1B is a plain view of the heat pipe in FIG. 1A.
Figure 1C:
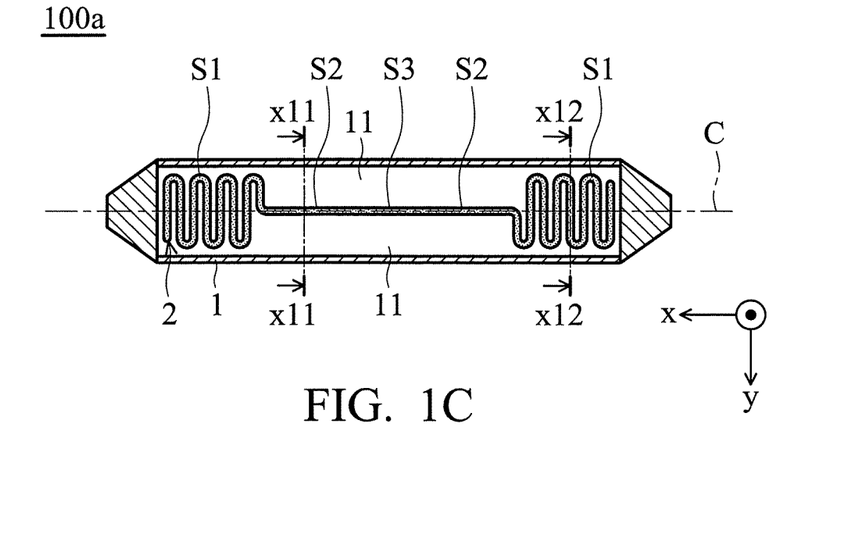
FIG. 1C is a cross-sectional view along line Z1-Z1 in FIG. 1A.
Figure 1D:
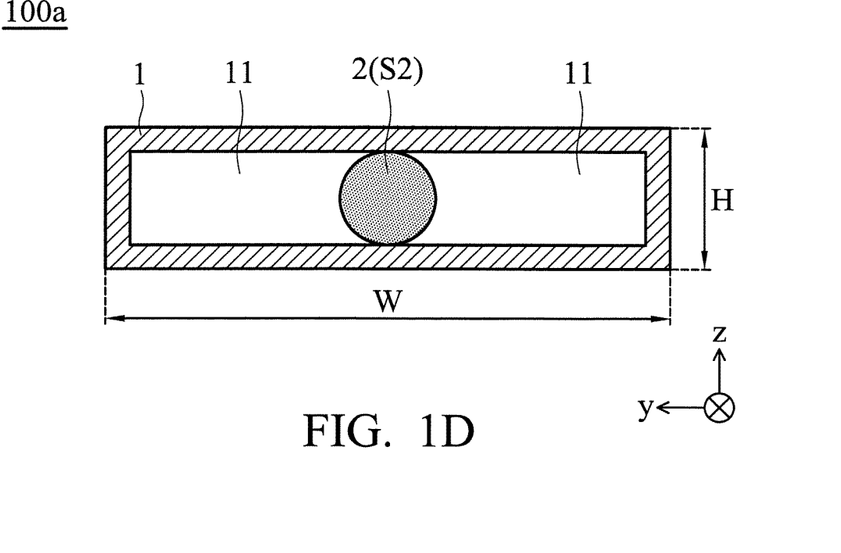
FIG. 1D is a cross-sectional view along line X11-X11 in FIG. 1C.
Figure 1E:
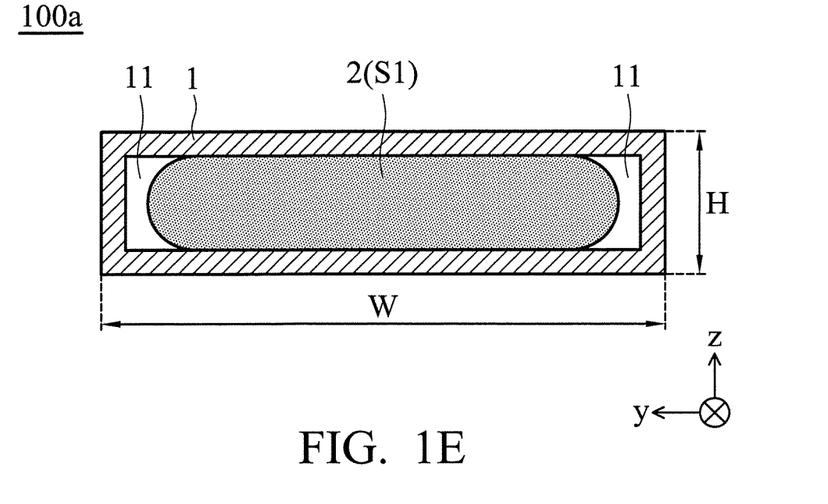
FIG. 1E is a cross-sectional view along line X12-X12 in FIG. 1C.

Referring to FIGS. 1A-1E, FIG. 1A is a perspective view of a heat pipe 100a according to an embodiment of the invention, FIG. 1B is a plain view of the heat pipe 100a in FIG. 1A, FIG. 1C is a cross-sectional view along line Z1-Z1 in FIG. 1A, and FIGS. 1D and 1E are the cross-sectional views along lines X11-X11 and X12-X12 in FIG. 1C. As shown in FIGS. 1A-IC, the heat pipe 100a comprises a housing 1 and a capillary body 2, wherein the housing 1 encompasses or accommodates the capillary body 2. The capillary body 2 has two evaporation portions S1, two connecting portions S2 and a condensation portion S3, wherein the two evaporation portions S1 are disposed at two opposite ends of the capillary body 2. A working fluid (not shown) is among the evaporation portions S1, the connecting portions S2, or the condensation portion S3, and is evaporated from the liquid phase to the gas phase at the evaporation portions S1. The condensation portion S3 is substantially disposed at the center of the capillary body 2, and the working fluid is condensed from the gas phase to the liquid phase at the condensation portion S3. The opposite ends of the connecting portion S2 are connected to the evaporation portion S1 and the condensation portion S3 respectively. Furthermore, as shown in FIGS. 1C-1E, two gas channels 11 formed between the inside wall of the housing 1 and both sides of the evaporation portions S1, the connecting portions S2, and the condensation portion S3 for the gas flowing in the housing 1.

As shown in FIG. 1C, the evaporation portions S1 are disposed at opposite ends of the heat pipe 100a and extended in a meandering manner, and the connecting portions S2 and the condensation portion S3 are substantially parallel to a central axis C of the heat pipe 100a. A cross-section of the evaporation portions S1 perpendicular to the central axis C is larger than that of the connecting portions S2 or the condensation portion S3 (as shown in FIGS. 1D and 1E), and the cross-section of the connecting portions S2 perpendicular to the central axis C is substantially the same as that of the condensation portion S3. The lengths of the evaporation portions S1, the connecting portions S2, and the condensation portion S3 along the central axis C can be defined appropriately to meet practical conditions (such as the heat-generating volume or the position of the heat source).

In the embodiment, the housing 1 has a hollow and longitudinal sealed structure, and a cross-section of the housing 1 is rectangular, wherein the width W of the housing 1 along the y-axis is greater than the thickness H of the housing 1 along the z-axis (as shown in FIGS. 1D and 1E), and the width W and the thickness H of the housing 1 are constant along the central axis C. In an embodiment, the cross-section of the housing 1 also may have the shape of an ellipse, a half-circle, a circular or a rectangular with chamfers. The extending path of the housing 1 may include a straight section and/or a curved section, and the ratio of the width W with respect to the thickness H can be modified to meet practical conditions.

It should be understood that the housing 1 may comprise metal with high thermal conductivity (such as copper), and the interior space of the housing 1 is filled with working fluid, such as water, ethanol, or another liquid having a low boiling temperature. The capillary body 2 may comprise metal and be formed in one-piece by weaving, for example it may be formed of three-dimensional weaves by a weaving machine or 3D printing. The density, thick, width, length, porosity, or permeability of the capillary body 2 can be appropriately designed according to different weaving processes to meet practical conditions. In some embodiments, the capillary body 2 may have a plain weave, satin weave, twilled weave, plain Dutch weave, twilled Dutch weave, or other weave structures or patterns.

When utilizing the heat pipe 100a to dissipate heat from a heat source (such as CPU), a section of the housing 1 corresponding to the evaporation portion S1 is in contact with the heat source, and another section of the housing 1 corresponding to the condensation portion S3 is in contact with a heat dissipating element (such as a fan, a fin, or a liquid cooling pump), in order to dissipate the heat absorbed by the evaporation portions S1, wherein the connecting portions S2 are connected between the evaporation portion S1 and the condensation portion S3.

As the interior space of the housing 1 is substantially filled with the evaporation portions S1 (as shown in FIG. 1E), the working fluid (liquid phase) can be sufficiently supplied to the evaporation portions S1. After the working fluid (liquid phase) absorbs heat from the heat source, its temperature rises to the boiling point and is transferred to the gas phase, and the working fluid (gas phase) is subsequently transferred through the gas channels 11 between the two sides of the connecting portions S2 and the housing 1 to the condensation portion S3, wherein the cross-sections of the connecting portions S2 and the condensation portion S3 are both smaller than that of the evaporation portion S1 (as shown in FIGS. 1D and 1E). That is, the cross-sections of the gas channels 11 perpendicular to the central axis C on both sides of the connecting portions S2 and the condensation portion S3 are greater than the cross-section of the connecting portion S2 and the condensation portion S3, thus facilitating the flow of the gas.

With the heat dissipated to the external environment through heat exchange between the condensation portion S3 and the heat dissipating element, the working fluid (gas phase) in the condensation portion S3 is cooled down to the condensation point and transferred into the liquid phase.

Subsequently, the working fluid (liquid phase) flows to the evaporation portion S1 along the capillary body 2 by capillary action, and it can absorb the heat in the evaporation portion S1 once more and repeat the above-mentioned processes, to continuously dissipate heat from the heat source to the external environment.

Figure 2:
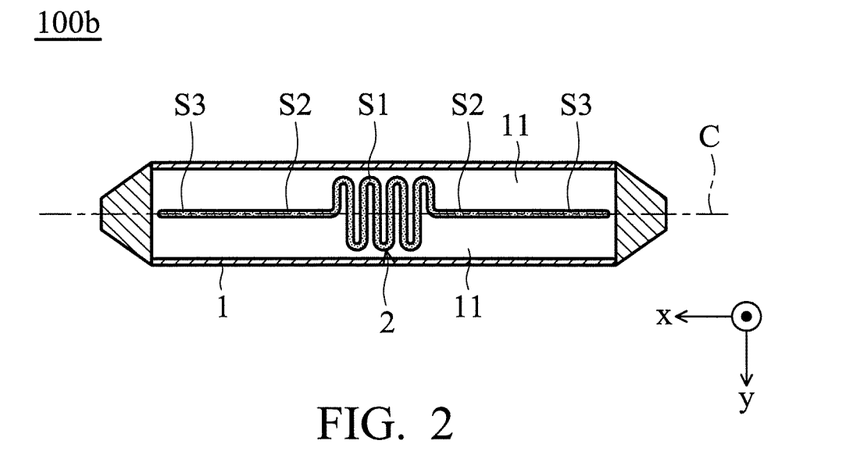
FIG. 2 is a cross-sectional view of a heat pipe along a longitudinal direction according to another embodiment of the invention.

Referring to FIG. 2, FIG. 2 is a cross-sectional view of a heat pipe 100b along a longitudinal direction according to another embodiment of the invention. The heat pipe 100b comprises a housing 1 and a capillary body 2, wherein the housing 1 encompasses or accommodates the capillary body 2, and the capillary body 2 has an evaporation portion S1, two connecting portions S2 and two condensation portions S3. As shown in FIG. 2, the difference between this embodiment and the embodiment shown in FIG. 1A is that the evaporation portion S1 of the capillary body 2 in this embodiment is substantially disposed at the center of the capillary body 2, and the two condensation portions S3 are disposed at both ends of the capillary body 2. The two opposite ends of the connecting portions S2 are connected to the corresponding evaporation portion S1 and the condensation portion S3, respectively. Furthermore, it is also shown in FIG. 2 that the capillary body 2 is disposed at the center of the heat pipe 100b in a meandering manner and substantially fills the interior space in the middle of the housing 1. The connecting portions S2 and the condensation portions S3 are extended substantially parallel to the central axis C. Two gas channels 11 are formed between the inside wall of the housing 1 and both sides of the connecting portions S2 and the condensation portions S3, respectively.

Figure 3A:
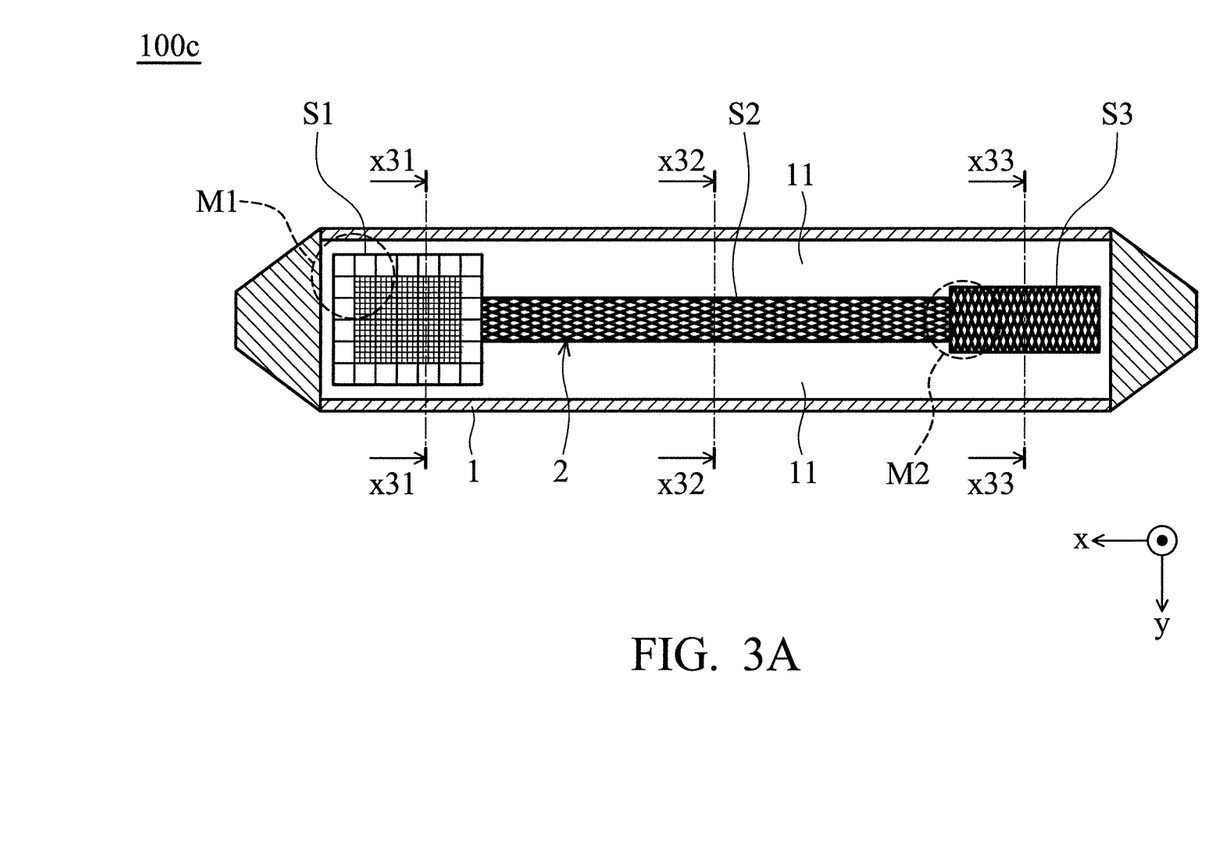
FIG. 3A is a cross-sectional view of a heat pipe along a longitudinal direction according to another embodiment of the invention.
Figure 3B:
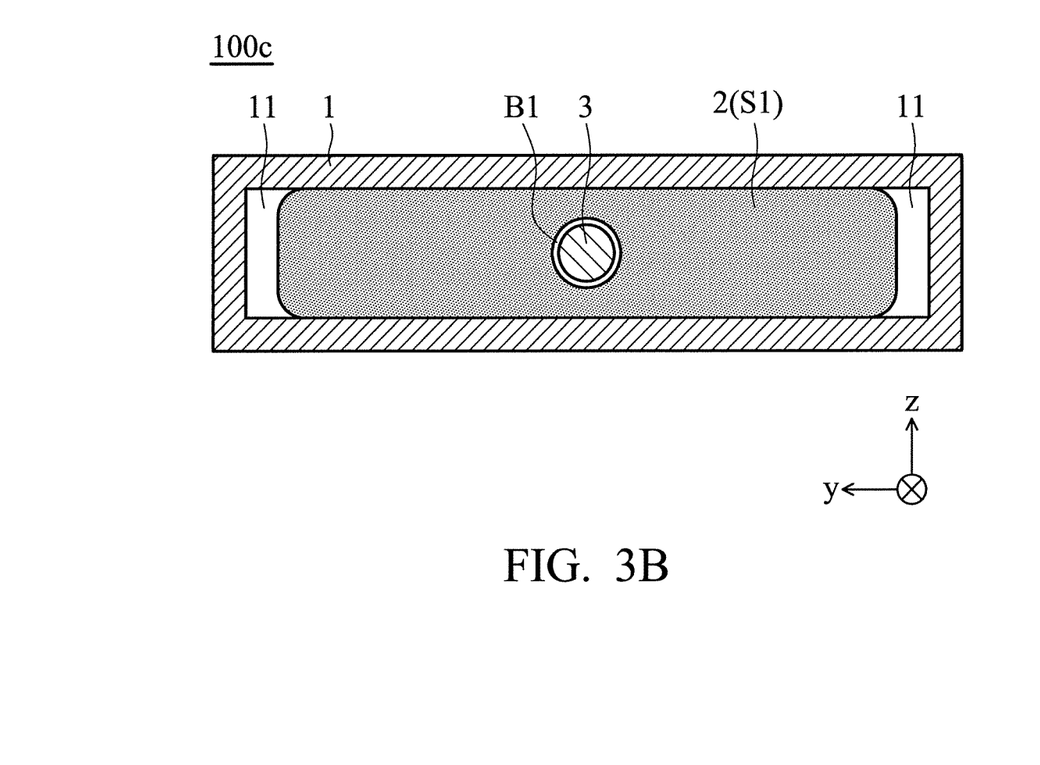
FIG. 3B is a cross-sectional view along line X31-X31 in FIG. 3A.
Figure 3C:
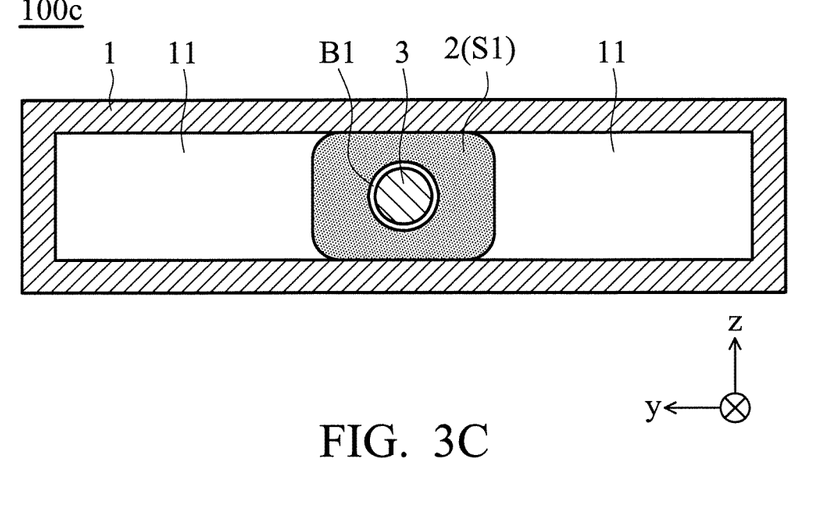
FIG. 3C is a cross-sectional view along line X32-X32 in FIG. 3A.
Figure 3D:
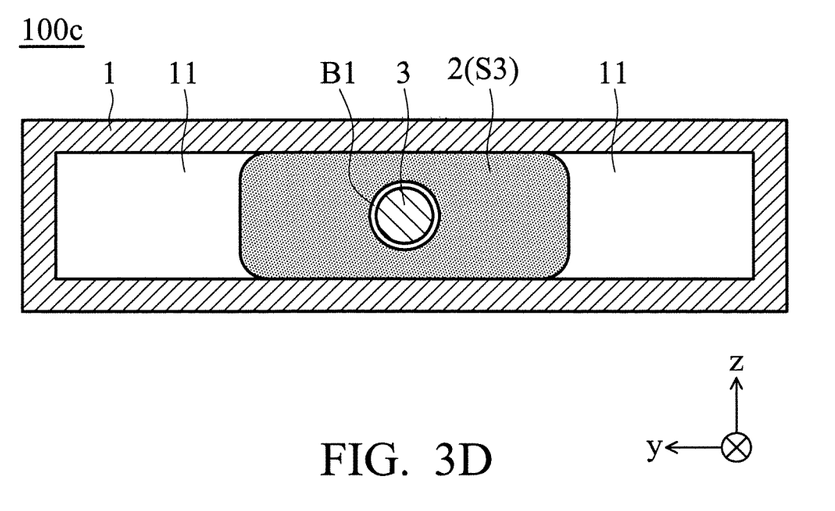
FIG. 3D is a cross-sectional view along line X33-X33 in FIG. 3A.

Referring to FIGS. 3A-3D, FIG. 3A is a cross-sectional view of a heat pipe 100c along a longitudinal direction according to another embodiment of the invention, and FIGS. 3B-3D are the cross-sectional views along lines X31-X31, X32-X32 and X33-X33 in FIG. 3A. As shown in FIGS. 3A-3D, the heat pipe 100c comprises a housing 1, a capillary body 2, and a supporting rod 3. The housing 1 encompasses or accommodates the capillary body 2, wherein the capillary body 2 has an evaporation portion S1, a connecting portion S2, a condensation portion S3, and a tubular cavity B1 (as shown in FIGS. 3B-3D). Two gas channels 11 are formed between the inside wall of the housing 1 and both sides of the connecting portion S2 and the condensation portion S3, respectively.

It is shown in FIG. 3A that the evaporation portion S1 is disposed at an end of the capillary body 2, and the condensation portion S3 is disposed at the other end of the capillary body 2. The opposite ends of the connecting portion S2 are connected to the evaporation portion S1 and the condensation portion S3, respectively. As shown in FIG. 3B-3D, the tubular cavity B1 is formed in the middle of the capillary body 2, and the supporting rod 3 is disposed in the tubular cavity B1. The evaporation portion S1 substantially fills the interior space of the longitudinal and closed housing 1 (as the left portion of the heat pipe 100c shows in FIG. 3B), wherein the cross-section of the evaporation portion S1 perpendicular to the central axis C is greater than that of the connecting portion S2 and the condensation portion S3, and the cross-section of the condensation portion S3 is greater than that of the connecting portion S2 (as shown in FIGS. 3B-3D).

In the embodiment, the housing 1 has a hollow and longitudinal sealed structure, and the cross-section of the housing 1 has a rectangular shape (as shown in FIGS. 3B-3D). The cross-sections of the tubular cavity B1 and the supporting rod 3 perpendicular to the central axis C has a round shape, and the tubular cavity B1 is extended through the capillary body 2. The supporting rod 3 is a longitudinal fixture used to facilitate forming the heat pipe 100c, comprising metal, non-metal, or hard plastic material. In some embodiments, the housing 1, the capillary body 2, and the supporting rod 3 may comprise a metallic materials of high thermal conductivity to improve the thermal efficiency. In some embodiments, the supporting rod 3 may comprise metal, non-metal, or alloy material formed by sintered powder, or mesh structure formed by the metal weaving. In some embodiments, the cross-section of the housing 1, the tubular cavity B1, and the supporting rod 3 may have the shape of rectangle, a rectangle with chamfers, a triangle, a polygon, an ellipse, or a circle.

Figure 3E:
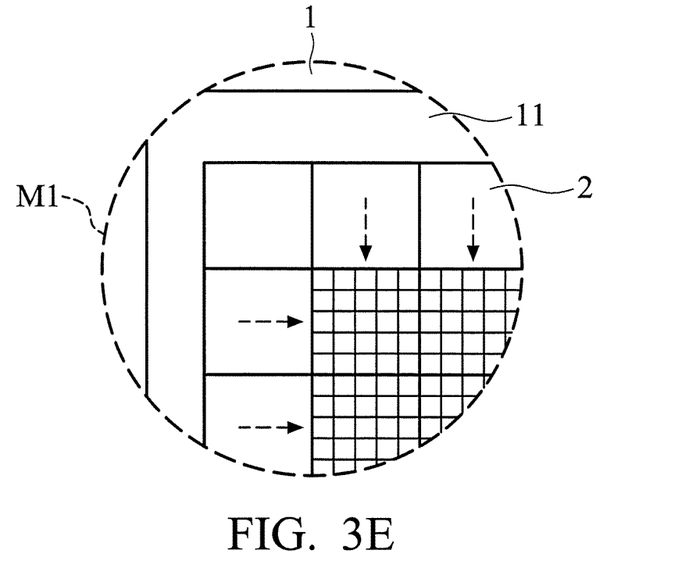
FIG. 3E is an enlarged view of the portion M1 in FIG. 3A.
Figure 3F:
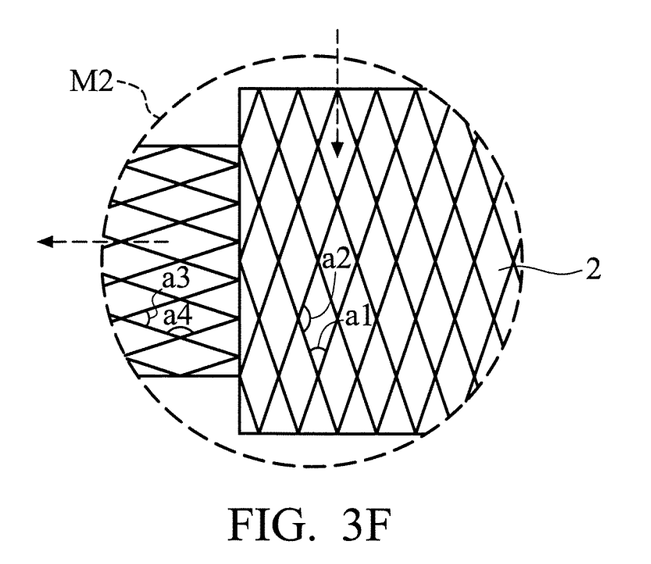
FIG. 3F is an enlarged view of the portion M2 in FIG. 3A.

Referring to FIGS. 3E and 3F, FIG. 3E is an enlarged view of the portion M1 in FIG. 3A, and FIG. 3F is an enlarged view of the portion M2 in FIG. 3A. As shown in FIGS. 3E and 3F, the capillary structure of the evaporation portion S1 has different densities. In this embodiment, the density of the capillary structure in the inner area of the evaporation portion S1 has a higher density than that of the outer area, so that capillary action of the working fluid occurs in the capillary body 2. Thus, the working fluid (liquid phase) in the evaporation portion S1 flows along the direction indicated by the broken lines and the arrows shown in FIG. 3E, and the working fluid (liquid phase) is then effectively collected in the portion of the heat pipe 100 near the heat source. Moreover, a first angle a1 and a second angle a2 are formed between the interlaced threads in the capillary structure of the evaporation portion S1 (as shown in FIG. 3F), wherein the first angle a1 is smaller than 90 degrees (i.e. an acute angle), and the second angle a2 is greater than 90 degrees (i.e. an obtuse angle). Therefore, the capillary structure can guide the working fluid (liquid phase) flowing in a specific direction, so that the working fluid (liquid phase) in the condensation portion S3 can flow along the direction indicated by the broken lines and the arrows shown in FIG. 3F. Similarly, the capillary structure of the connecting portion S2 can also be appropriately modified to guide the working fluid (liquid phase) to flow in a specific direction, such as a third angle a3 and a fourth angle a4 formed between the interlaced threads in the capillary structure of the connecting portion S2 (FIG. 3F), wherein the third angle a3 is smaller than 90 degrees (i.e. an acute angle), and the fourth angle a4 is greater than 90 degrees (i.e. an obtuse angle).

Figure 4A:
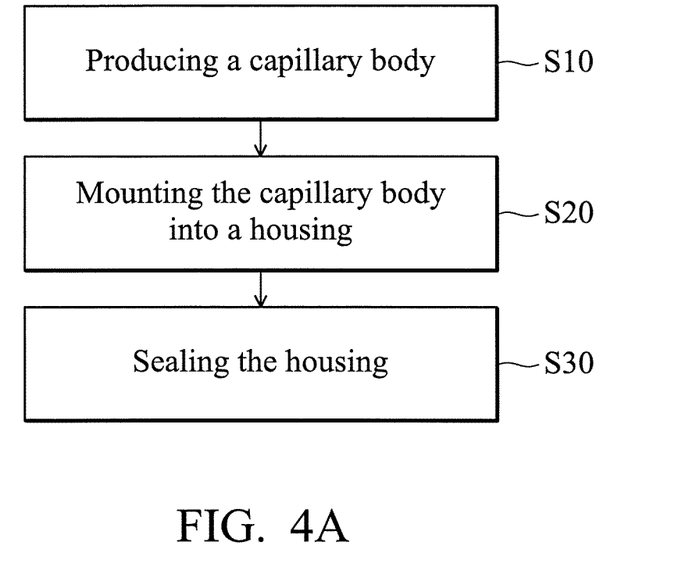
FIG. 4A is a diagram illustrating a method for making the heat pipe according to an embodiment of the invention.

Referring to FIG. 4A, FIG. 4A is a diagram illustrating a method for making the heat pipe 100 according to an embodiment of the invention. The method comprises a first step of producing a capillary body 2 (step S10), putting and mounting the capillary body 2 into a housing 1 (step S20), and sealing the housing 1 (step S30) at the end to isolate the interior of the housing 1 from the external environment, so that the capillary body 2 is encompassed or accommodated by the housing 1, and the working fluid is prevented from leaking to the external environment. In step S20, a rod (not shown) may be disposed in the space between the capillary body 2 and the housing 1 while putting the capillary body 2 into the housing 1, so that the weave structure of the capillary body 2 can be firmly connected to the housing 1. Specifically, before processing step S30, the rod can be removed to form the gas channel 11.

During step S10 in FIG. 4A, a capillary body 2 with a weave structure (or pattern) is produced, wherein the weave structure may be formed by metal weaving, such as three-dimensional weaving by a weaving machine or by 3D printing, and the weaves may include a plain weave, satin weave, twilled weave, plain Dutch weave, or twilled Dutch weave. In additional, if the structure of the heat pipe needs to be bent, the structural strength of the bent portion of the capillary body 2 has to be stronger than that of other un-bent portions, and the bent portion can be woven by twisted pair weaving, multi-layer weaving, or thick weaving (such as twilled weaving) to prevent the capillary body 2 from fractures or structural failure during the bending process, thus ensuring the thermal efficiency of the heat pipe.

Figure 4B:
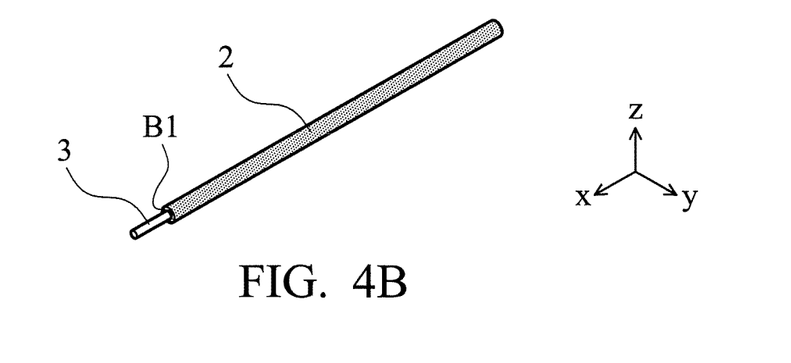
FIG. 4B shows the details related to the method for making the heat pipe.
Figure 4C:
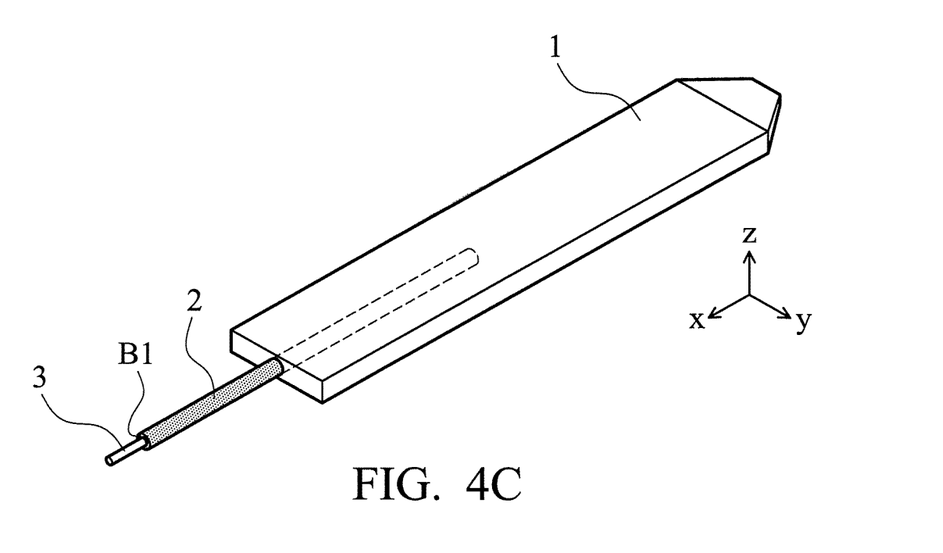
FIG. 4C shows the details related to the method for making the heat pipe.
Figure 4D:
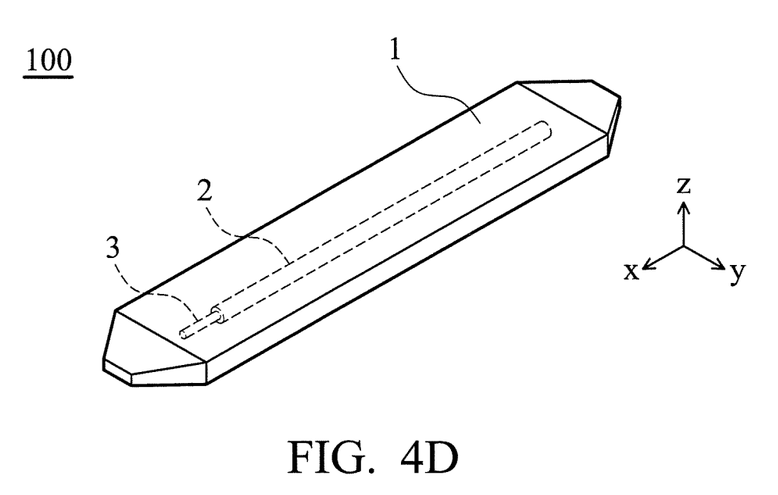
FIG. 4D shows the details related to the method for making the heat pipe.

Referring to FIGS. 4B-4D, the details related to the method for making the heat pipe 100 are described as follows. The first step is to insert the supporting rod 3 into the tubular cavity B1, or wind the capillary body 2 on the supporting rod 3. The supporting rod 3 in the capillary body 2 can form the tubular cavity B1 (FIG. 4B), wherein the supporting rod 3 protrudes from an end of the capillary body 2 for the manufacturing operators to easily hold and move the capillary body 2 during assembly (step S10). Next, the supporting rod 3 partially covered by the capillary body 2 is inserted in the half-sealed housing 1 from an entrance end of the housing 1 (FIG. 4C), and the capillary body 2 is secured in a predetermined position in the housing 1 (step S20). Finally, the entrance end of the housing 1 is sealed (step S30) to complete the production of the heat pipe 100 (FIG. 4D). In an embodiment, after the capillary body 2 is inserted into the housing 1, the manufacturing operators may draw the supporting rod 3 out of the tubular cavity B1. The invention does not limit the supporting rod 3 has to being disposed in the heat pipe 100 or not.

Figure 5A:
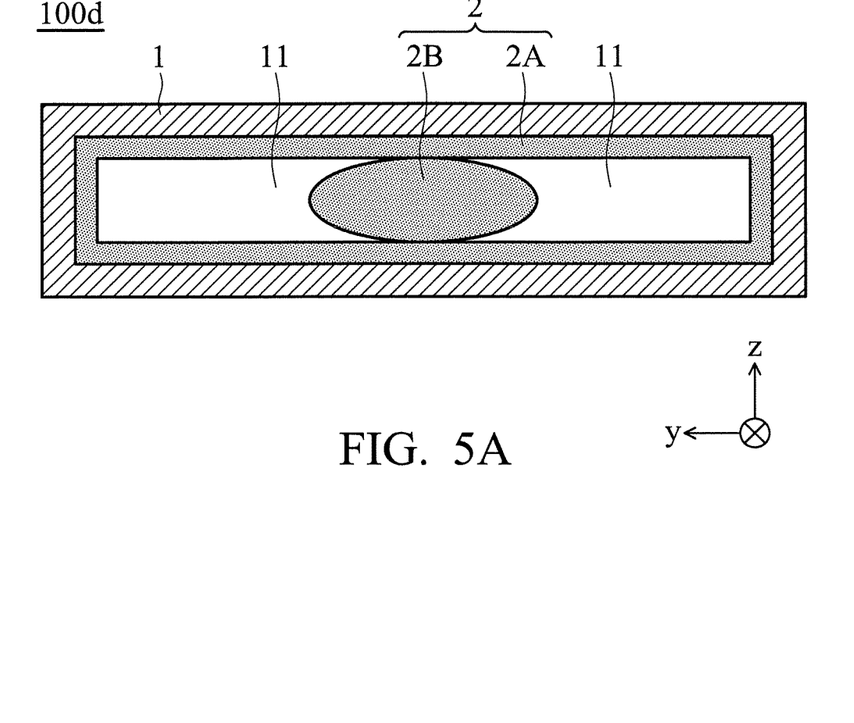
FIG. 5A is a cross-sectional view of a heat pipe along a transverse direction according to another embodiment of the invention.

Referring to FIG. 5A, FIG. 5A is a cross-sectional view of a heat pipe 100*d* along a transverse direction according to another embodiment of the invention. As shown in FIG. 5A, the heat pipe 100*d* comprises a housing 1 and a capillary body 2 formed by metal weaving, wherein the housing 1 encompasses or accommodates the capillary body 2. The difference between this embodiment and the embodiment shown in FIGS. 1D and 1E is that the capillary body 2 has a first capillary structure portion 2A and a second capillary structure portion 2B, wherein the first capillary structure portion 2A is hollow and has a cross-section with a rectangular shape, and the outer surface of the first capillary structure portion 2A is in contact with the inner surface of the housing 1. Furthermore, the second capillary structure portion 2B has a cross-section with an elliptical shape with opposite sides thereof connected to the inner surface of the first capillary structure portion 2A. The thermal conductivity can therefore be improved as the first capillary structure portion 2A connects the housing 1 with the second capillary structure portion 2B. It should be understood that the shape of the cross-section of the second capillary structure portion 2B is not limited to being elliptical in this invention; the cross-section may also have a rectangular shape, a rectangular shape with a chamfer, or it may have the shape of a triangle, a polygon, or a circle.

Figure 5B:
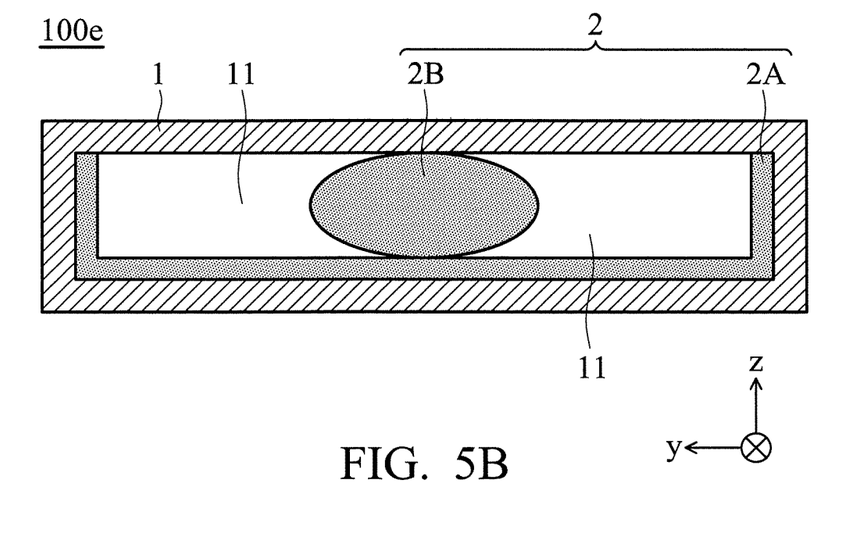
FIG. 5B is a cross-sectional view of a heat pipe along a transverse direction according to another embodiment of the invention.

Referring to FIG. 5B, FIG. 5B is a cross-sectional view of a heat pipe 100*e* along a transverse direction according to another embodiment of the invention. As shown in FIG. 5B, the heat pipe 100*e* comprises a housing 1 and a capillary body 2 formed by metal weaving, wherein the housing 1 encompasses or accommodates the capillary body 2. The capillary body 2 has a U-shaped first capillary structure portion 2A and a second capillary structure portion 2B, and the outer surface of the first capillary structure portion 2A is in contact with the inner surface of the housing 1. The second capillary structure portion 2B has a cross-section with an elliptical shape, wherein the second capillary structure portion 2B has at least one side connected to the inner surface of the first capillary structure portion 2A, and another side connected to the inner surface of the housing 1. In the embodiment, the heat source and/or the heat dissipating element are/is in contact with one side of the heat pipe 100*e* (the lower side of the housing in FIG. 5B), and this configuration can facilitate a lower production cost than the configuration in FIG. 5A.

In summary, the invention provides a heat pipe, comprising a capillary structure formed by metal weaving. It is beneficial for producing the cross-section in different sizes, weaves, or patterns, and it is also easy to appropriately modify the density, shape and porosity of the capillary structure, to improve thermal conductivity. Moreover, a weaving process is suitable for abundantly producing the capillary structure or pattern, and it can improve the production quality, yield rate of the heat pipe, and reduce the production cost. Furthermore, the structural strength of the bent portion of the capillary structure can also be enhanced since the weave structure is flexible and difficult to be fractured.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat pipe, comprising:
   a housing;
   a capillary body, encompassed by the housing, comprising:
   an evaporation portion, having a first cross-section perpendicular to a central axis of the heat pipe, wherein more than 50% of an interior space of the housing is filled with the evaporation portion;
   a condensation portion, having a second cross-section perpendicular to the central axis, wherein the first cross-section is larger than the second cross-section;
   a connecting portion, connecting the condensation portion with the evaporation portion;
   wherein the capillary body has a plurality of capillary structures forming by metal weaving, and the plurality of capillary structures comprise a low density region and a high density region in the evaporation portion, wherein the low density region surrounds the high density region, and
   a working fluid, flowing in the evaporation portion, the connecting portion, or the condensation portion, wherein the working fluid is guided by the plurality of capillary structures to flow in a specific direction from the low density region to the high density region in the evaporation portion;
   wherein the capillary body has a tubular cavity.

2. The heat pipe as claimed in claim 1, wherein a gas channel is formed between the housing, the evaporation portion, the connecting portion, and the condensation portion.

3. The heat pipe as claimed in claim 1, wherein the working fluid is evaporated in the evaporation portion.

4. The heat pipe as claimed in claim 1, wherein the working fluid is condensed in the condensation portion.

5. The heat pipe as claimed in claim 1, further comprising a supporting rod disposed in the tubular cavity.

6. The heat pipe as claimed in claim 1, wherein the tubular cavity is extended through the capillary body.

7. The heat pipe as claimed in claim 1, wherein the capillary body has plain weave, satin weave, twilled weave, plain Dutch weave, or twilled Dutch weave.

8. The heat pipe as claimed in claim 7, wherein the capillary body of the condensation portion forms a first angle and a second angle between two interlaced threads thereof, wherein the first angle is smaller than 90 degrees, and the second angle is greater than 90 degrees.

9. The heat pipe as claimed in claim 8, wherein the capillary body of the connecting portion forms a third angle and a fourth angle between two interlaced threads thereof, wherein the third angle is smaller than 90 degrees, and the fourth angle is greater than 90 degrees.

10. The heat pipe as claimed in claim 8, wherein the working fluid flows from the first angle to the second angle.

11. The heat pipe as claimed in claim 1, wherein the capillary structures are formed in one-piece.

12. The heat pipe as claimed in claim 1, wherein more than 70% of an interior space of the housing is filled with the evaporation portion.

\* \* \* \* \*